United States Patent [19]
Wu

[11] Patent Number: 6,167,001
[45] Date of Patent: Dec. 26, 2000

[54] METHOD AND APPARATUS FOR MEASURING SETUP AND HOLD TIMES FOR ELEMENT MICROELECTRONIC DEVICE

[75] Inventor: Yiding Wu, Los Gatos, Calif.

[73] Assignee: Xilinx, Inc., San Jose, Calif.

[21] Appl. No.: 09/237,574

[22] Filed: Jan. 26, 1999

[51] Int. Cl.$^7$ .............................. G04F 8/00; G04F 10/00; G01R 31/28; G06F 17/50
[52] U.S. Cl. ................................ 368/113; 714/731; 716/6
[58] Field of Search ........................... 364/113, 118–120; 714/731; 716/6

[56] References Cited

U.S. PATENT DOCUMENTS

| | | | |
|---|---|---|---|
| 4,799,023 | 1/1989 | Firooz et al. | 328/10 |
| 5,268,639 | 12/1993 | Gasbarro et al. | 324/158 R |
| 5,357,195 | 10/1994 | Gasbarro et al. | 324/158.1 |
| 5,555,187 | 9/1996 | Spyrou | 364/490 |
| 5,689,517 | 11/1997 | Ruparel | 371/22.3 |
| 5,768,159 | 6/1998 | Belkadi et al. | 364/576 |
| 6,085,345 | 7/2000 | Taylor | 714/731 |

*Primary Examiner*—Vit Miska
*Attorney, Agent, or Firm*—Bever, Hoffman & Harms, LLP; Jeanette S. Harms

[57] ABSTRACT

A microelectronic device such as a Field-Programmable Gate Array (FPGA) includes a large number of elements which can be individually configured or programmed to provide a desired logical functionality. Input and output pins enable external connection of the elements. Each element is configurable to produce an output in response to a first pulse which is applied more than a minimum length of time after a second pulse. The first pulse can be a clock pulse, and the second pulse can be a data pulse, in which case the minimum length of time is the setup time for the element. Each element of a device is tested by repeatedly applying first and second pulses to the device with a delay of the second pulse relative to the first pulse being progressively changed from a first value until a second value corresponding to the minimum length of time is reached as indicated by a transition between the output being produced and the output not being produced. The element is then scanned using the first and second pulses and reference pulses with the delay set at the second value to determine the minimum length of time. The scanning procedure can also be used to measure a hold time, a time difference between input and output pulses, or a time difference between two output pulses.

50 Claims, 17 Drawing Sheets

METHOD AND APPARATUS FOR MEASURING SETUP AND HOLD TIMES FOR ELEMENT MICROELECTRONIC DEVICE

FIELD OF THE INVENTION

The present invention generally relates to the art of microelectronic integrated circuits, and more specifically to a method and apparatus for measuring setup and hold times for an element of a microelectronic device.

BACKGROUND OF THE INVENTION

A microelectronic device such as a Field-Programmable Gate Array (FPGA) includes a large number of elements, typically logic gates, which can be individually configured or programmed to provide a desired logical functionality. Input and output pins enable external connection of the elements. Setup and hold times relate to the timing relationship between data and clock pulses applied to an element which is configured as a flip-flop or any other bistable element. Flip-flops and similarly configured elements are typically used as memory and register cells.

The setup time is the minimum length of time that a data signal must be available and stable at an input of a flip-flop before a leading edge of clock pulse is applied. If the clock pulse is applied too soon after the data signal, the setup time will be violated (less than the minimum length of time) and the flip-flop will not predictably produce the desired output signal, i.e. a signal having the same logic state as the data input signal.

The hold time is similar to the setup time, and is the minimum length of time that the data must be available and stable after the leading edge of the clock pulse. If the hold time is violated, the flip-flop will not accurately register the new data. The setup and hold times are related as will be described in detail below.

The setup and hold times of FPGAs and other microelectronic devices must be accurately tested to maintain quality control and predict device performance. This testing is conventionally performed manually using a procedure as illustrated in FIG. 1.

As shown in the drawing, a testing system 10 includes a 2-channel pulse generator 12 which generates data pulses DATA and clock pulses CLOCK, and a 3-channel oscilloscope 14 which receives the DATA, CLOCK and output pulses OUTPUT from a microelectronic device 16 under test at its three input channels. The device 16 is inserted in an appropriate test socket (not shown), and supplied with appropriate operating voltages by a power supply 18. A personal computer 20 is further illustrated for storing the test results.

The testing is performed by a human operator 22 who manually manipulates the illustrated components of the system 10. The procedure for measuring the setup time is shown in FIGS. 2 to 4. The test is performed for each element of the device 16, during which an element 24 being tested is preferably configured as a D-type flip-flop having a data input D, a clock input C and a positive logic output Q.

As illustrated in FIGS. 1 and 2, the pulse generator 12 generates first pulses, in this case the clock pulses CLOCK, and second pulses, in this case the data pulses DATA, which appear on the oscilloscope 14. If the setup time of the element 24 is not violated, or if the leading edges of the first or CLOCK pulses are applied more than a minimum length (the setup time) after the leading edges of the second or DATA pulses, the element 24 will produce the OUTPUT pulses having leading edges which appear shortly after the leading edges of the CLOCK pulses. If the setup time is violated, the OUTPUT pulses will not be predictable.

The CLOCK pulses are applied to the element 24 without any time delay, or with a predetermined fixed time delay. The leading edges of the CLOCK pulses will always appear on the oscilloscope 14 at a relative time T0. However, the pulse generator 12 is able to generate the DATA pulses with a variable delay relative to the CLOCK pulses such that DATA pulses appear to move toward (shift rightwardly) or away (shift leftwardly) from the CLOCK pulses.

Increasing the delay causes the DATA pulses to move rightwardly toward the CLOCK pulses and vice-versa. Of course, an equivalent result can be obtained by generating the DATA pulses with a fixed delay and generating the CLOCK pulses with a variable delay, or suitably delaying both the DATA and CLOCK pulses.

The operator 22 controls the pulse generator 12 such that the DATA pulses are initially generated so their leading edges appear on the oscilloscope 14 at a relative time T1. The difference between the relative times T0 and T1 is designated as a first value D1 of delay of the DATA pulses relative to the CLOCK pulses. The delay D1 is selected to be sufficiently larger than the setup time that the OUTPUT pulses will accurately appear.

Then, referring to FIGS. 1 and 3, the operator 22 increases the delay of the DATA pulses as indicated by an arrow 26 to a relative time T2 at which the relative delay has a third value D3. At this transition point, the OUTPUT pulses disappear as indicated by the broken line.

Referring to FIGS. 1 and 4, the operator 22 then decreases the delay of the DATA pulses as indicated by an arrow 28 until a relative time T3 is reached at which the relative delay has a value of D2. At this transition point, the OUTPUT pulses reappear as indicated in solid line.

The operator 22 then uses the oscilloscope 14 to manually measure the delay D2 (the difference between the relative times T0 and T3), which is the minimum length of time or the setup time as described above, and stores an identification number for the element 24 and the corresponding setup time in the computer 20. Note that the horizontal time scale of the oscilloscope is typically calibrated in nanoseconds (ns) as illustrated in FIGS. 2 to 4 to enable visual readings of the relative times T0 and T3 and calculation of the difference therebetween based on the visual readings.

As described above, the delay of the DATA pulses is changed so that the OUTPUT pulses first disappear as viewed in FIG. 3 and then reappear as viewed in FIG. 4. This is done because there is a metastable area in the relative delay time in which the setup time is violated for some pulses and not for others.

However, it is possible to practice this method by performing only the steps of FIGS. 2 and 3, and designating the delay D3 as the setup time. It is also possible to practice the method by starting with a delay of the DATA pulses relative to the CLOCK pulses which is sufficiently small or negative to ensure that the OUTPUT pulses do not appear, and then decreasing the delay of the DATA pulses until the pulses appear. These alternative methods will produce results which may be satisfactory for some applications, but will not be as accurate as the method illustrated in FIGS. 2 to 4.

The conventional method described above, although capable of measuring setup and hold times with a useful degree of accuracy, suffers from major drawback in that it is performed manually by a human operator. This manual operation is very slow compared to a computer-automated operation, and is also limited in accuracy in that the operator must subjectively judge the delay using a relatively crude time scale on the oscilloscope. This manual operation is further undesirable in that the accuracy can be adversely affected by the operator's eyesight, emotional level, fatigue, stress level and other factors.

SUMMARY OF THE INVENTION

The present invention overcomes the drawbacks of the prior art by providing a method and apparatus for measuring setup and hold times, as well as time differences between other input and output signals, in programmable or configurable microelectronic devices.

More specifically, a microelectronic device such as a Field-Programmable Gate Array (FPGA) includes a large number of elements which can be individually configured or programmed to provide a desired logical functionality. Input and output pins enable external connection of the elements. Each element is configurable to produce an output signal in response to a first pulse which is applied more than a minimum length of time after a second pulse.

The first pulse can be a clock pulse, and the second pulse can be a data pulse, in which case the minimum length of time is the setup time for the element. Each element of a device is tested by repeatedly applying first and second pulses to the device with a delay of the second pulse relative to the first pulse being progressively changed from a first value until a second value corresponding to the minimum length of time is reached as indicated by a transition between the output being produced and the output not being produced.

The element is then scanned using the first and second pulses and reference pulses with the delay set at the second value to determine the minimum length of time. The scanning procedure can also be used to measure a hold time, a time difference between input and output pulses, or a time difference between two output pulses caused by different capacitive loading of corresponding output pins.

The present invention produces more accurate, realistic and reliable results than the prior art. Specifically, the present invention produces highly accurate results because it takes measurements directly on the device under test. Because the prior art takes measurements some distance away from the device, the prior art is sensitive to the relative lengths of interconnecting wires.

The invention produces realistic results because its calculation is based on precisely when a signal makes a transition from one logic level to another. In contrast, the prior art calculates the results based on reference levels fed into the oscilloscope.

The invention produces reliable results because it includes a built-in system feedback. In contrast, the prior art relies on the subjective (and potentially inaccurate) judgement made by the human operator for the feedback.

The present invention is also fast. For example, the present invention can make 72 measurements in less than 2 minutes whereas the prior art manual method would take hours to do the same measurements.

Finally, the present invention can be applied to more general cases than just setup and hold time measurements. For example, the present methods can also be applied in general to numerous types of measurements that involve the delay between two signals.

These and other features and advantages of the present invention will be apparent to those skilled in the art from the following detailed description, taken together with the accompanying drawings, in which like reference numerals refer to like parts.

DETAILED DESCRIPTION OF THE DRAWINGS

Fundamental Concepts

A primary application for the present method and apparatus is to measure the setup and hold times for elements of a microelectronic device such as a Field-Programmable Gate Array (FPGA) as presented above. Other applications for the present invention include measuring the time differences between various combinations of input and output signals as described in detail below.

Figure 5:
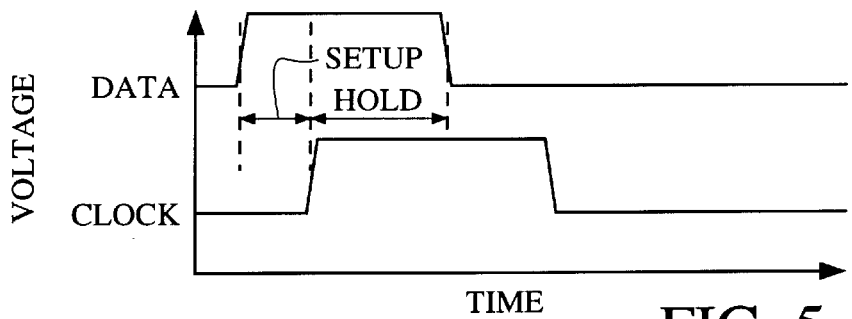
FIGS. 5 to 8 are timing diagrams illustrating relationships between setup and hold times for different configurations of pulse edges and data levels for a D-type flip-flop.

FIGS. 5 to 8 illustrate the relationships between setup and hold times for different configurations of pulse edges and data levels. FIG. 5 illustrates a case in which both the DATA and CLOCK pulses have positive logic levels. The setup time is between the rising edges of the DATA and CLOCK pulses, whereas the hold time is between the falling edge of the DATA pulse and the rising edge of CLOCK pulse.

Figure 6:
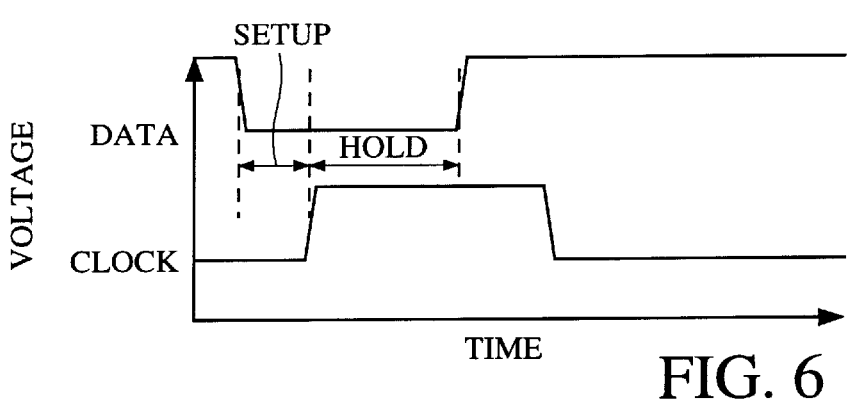

FIG. 6 illustrates a case in which the DATA pulse has a negative logic level and the CLOCK pulse has a positive logic level. In this case, the setup time is between the falling edge of the DATA pulse and the rising edge of the CLOCK pulse, whereas the hold time is between the rising edge of the DATA pulses and the rising edge of the same CLOCK pulse.

Figure 7:
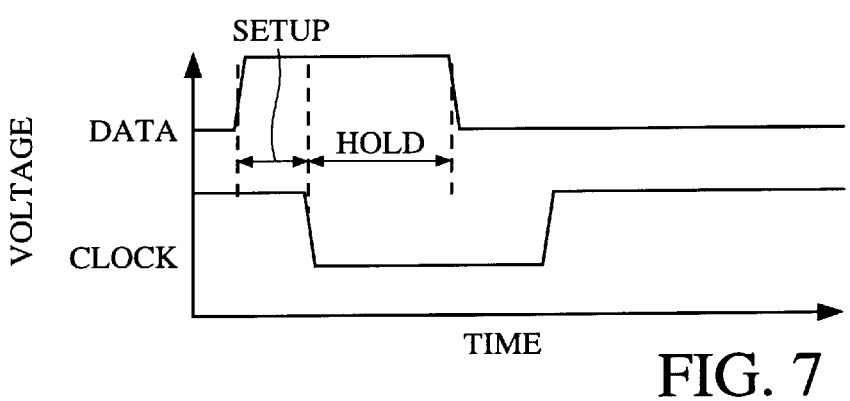

FIG. 7 illustrates a case in which the DATA pulse has a positive logic level and the CLOCK pulse has a negative logic level. The setup time is between the rising edge of the DATA pulses and the falling edge of the CLOCK pulse, whereas the hold time is between the falling edge of the DATA pulse and the falling edge of the CLOCK pulse.

Figure 8:
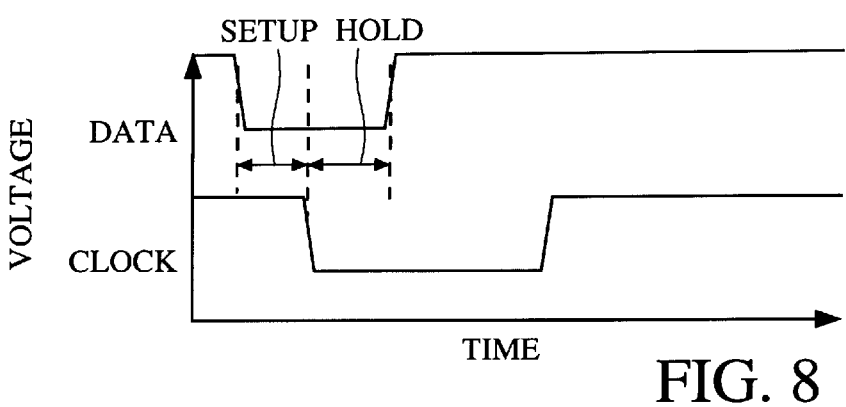

FIG. 8 illustrates a case in which both the DATA and CLOCK pulses have negative logic levels. In this case, the setup time is between the falling edges of the DATA and CLOCK pulses, whereas the hold time is between the rising edge of the DATA pulse and the falling edge of the CLOCK pulse.

There is a correspondence between setup and hold times which makes it necessary to measure only one or the other time. As viewed in FIG. 5, the setup time is between the rising edges of the DATA and CLOCK pulses. The hold time in FIG. 6 is also between rising edges of these pulses. Therefore, the hold time for the configuration of FIG. 6 is equivalent to and can be determined by measuring the setup time for the configuration of FIG. 5. Similarly, the hold times for the configurations of FIGS. 5, 6, 7, and 8 are equivalent to the setup times for the configurations of FIGS. 6, 5, 8 and 7 respectively.

Thus, the setup and hold times for all four configurations of FIGS. 5 to 8 can be determined by measuring only the setup (or alternatively the hold) times. In other words, only four measurements are required for each element for a given supply voltage level. For example, in an application in which three levels of supply voltage, e.g. 3.0V, 3.3V and 3.6V, can alternatively be used, a total of 12 setup time measurements will be taken for each DATA/CLOCK pin configuration.

If each device under test has 6 DATA/CLOCK pin combinations, a total of 72 measurements for corresponding sets of test parameters will be taken for each element. A total of several hours would be required to perform these 72 measurements using the prior art manual method described above. However, an apparatus embodying the present invention can perform these measurements in approximately 2 minutes or less.

Configuration of the Apparatus

Figure 13:
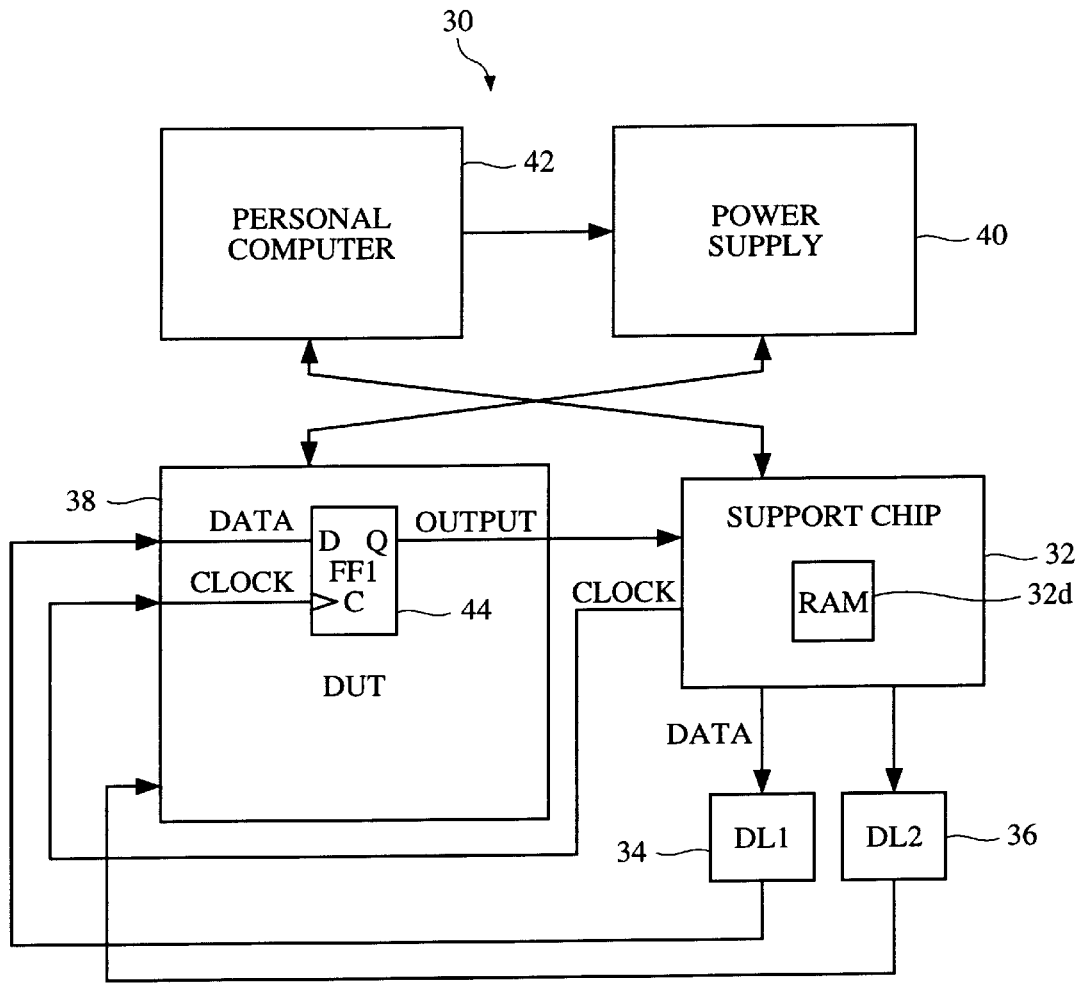
FIG. 13 is a diagram illustrating a testing apparatus according to the invention.

An apparatus 30 for performing a method according to the present invention is illustrated in FIG. 13. The apparatus 30 includes a support chip 32 having output terminals connected to a first delay line 34 and a second delay line 36. Operating voltages are applied to a microelectronic device 38 under test, by a power supply 40 under control of a personal computer 42.

The device 38 is typically an FPGA, although the invention is applicable to a large variety of programmable devices. The device 38 is inserted into a suitable test socket (not shown), and includes at least one element 44 which is programmed as a D-type flip-flop for performing the present test method. The element 44 is connected externally via input and output pins (not explicitly illustrated in the drawing).

The configured element 44 has a data input D which is connected to receive DATA pulses from the output of the delay line 34 and a clock input C which is connected to an output of the support chip 32. A positive logic output Q of the element 44 is connected to an input of the chip 32.

Figure 14:
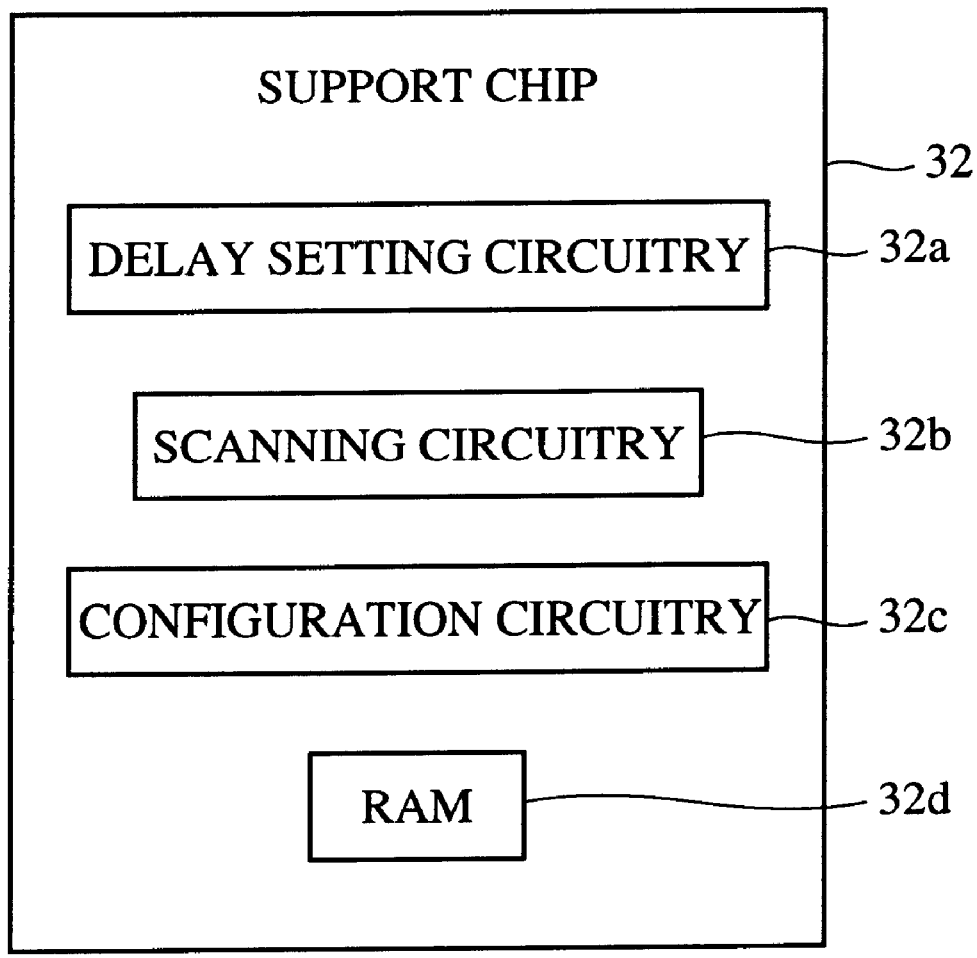
FIG. 14 is a diagram illustrating a support chip of the apparatus of FIG. 13.

As shown in FIG. 14, the support chip 32 includes delay setting circuitry 32a, scanning circuitry 32b, configuration circuitry 32c and a Random Access Memory (RAM) 32d. The functional components 32a–32d of the support chip 32 may include any suitable combination of hardware and software, and may be integral (e.g. include a microprocessor under program control). The distinction between these elements should be considered functional rather than physical, and non-limitative of the scope of the invention.

Delay Setting Operation For Measuring Setup Time

As viewed in FIG. 13, the configuration circuitry 32c of the support chip 32 first programs (also referred to in the art as configuring) the element 44 as a D-type flip-flop as described above. Then, the delay setting circuitry 32a automatically performs the operations described above with reference to FIGS. 2 to 4 to determine the relative times T0 and T3, thereby providing a measure of the setup time or second delay D2.

More specifically, the delay lines 34 and 36 are programmable by the support chip 32 to provide a variable delay for the signals passing therethrough. An exemplary delay line chip which is available as an off-the-shelf component for embodying the delay lines 34 and 36 is the Dallas Semiconductor DS1020-25. It delays an input signal according to the logic levels on an 8-bit parallel port, which allows up to 256 steps of delay. The size of each step varies according to various models. The DS1020-25 has a step size of 0.25 ns. Accordingly, the maximum programmable range of delay is 256×0.25 ns=64 ns.

Figure 1:
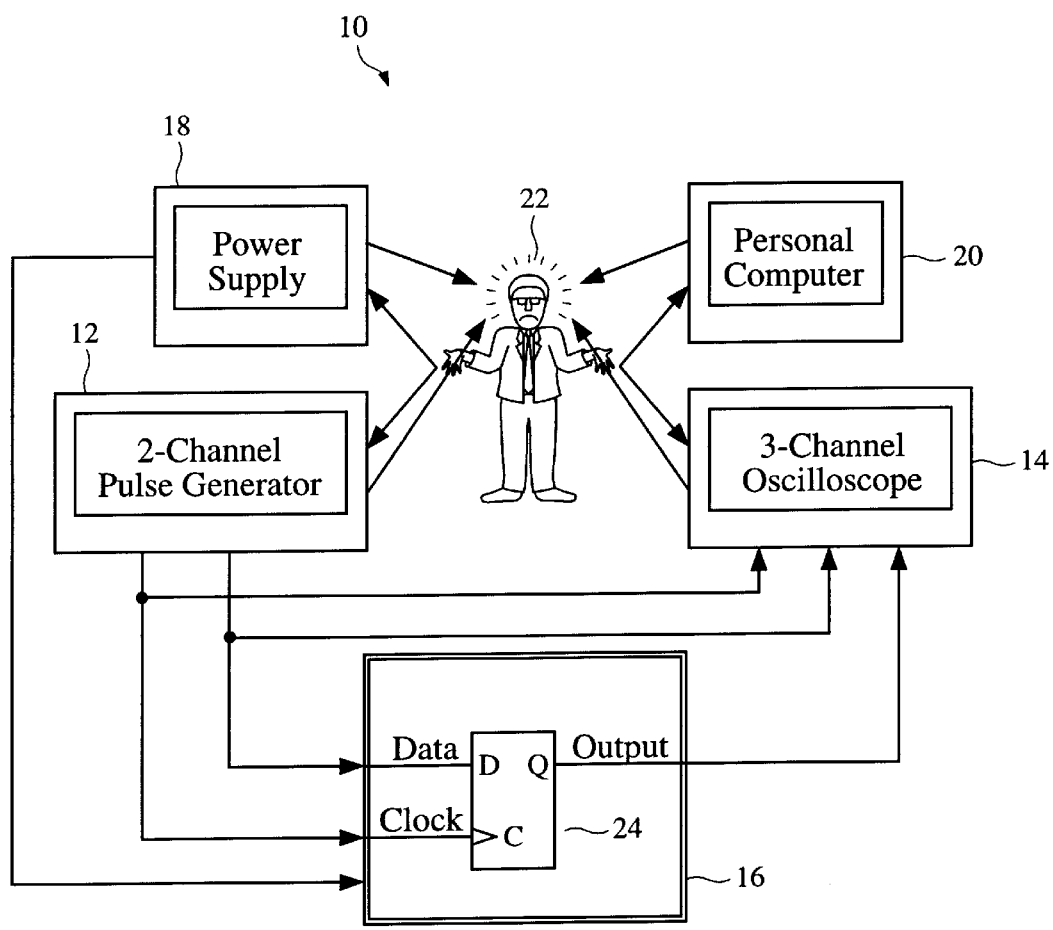
FIG. 1 is a diagram illustrating a conventional method for measuring setup and hold times for an element of a microelectronic device.
Figure 2:
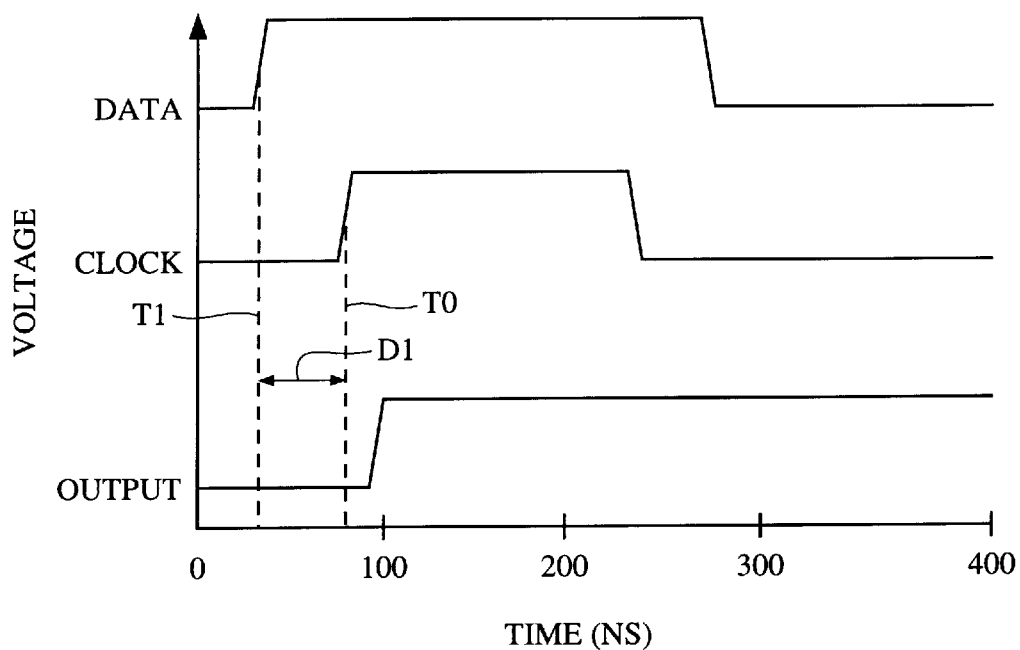
FIGS. 2, 3 and 4 are timing diagrams illustrating the principles of the method of FIG. 1.
Figure 15:
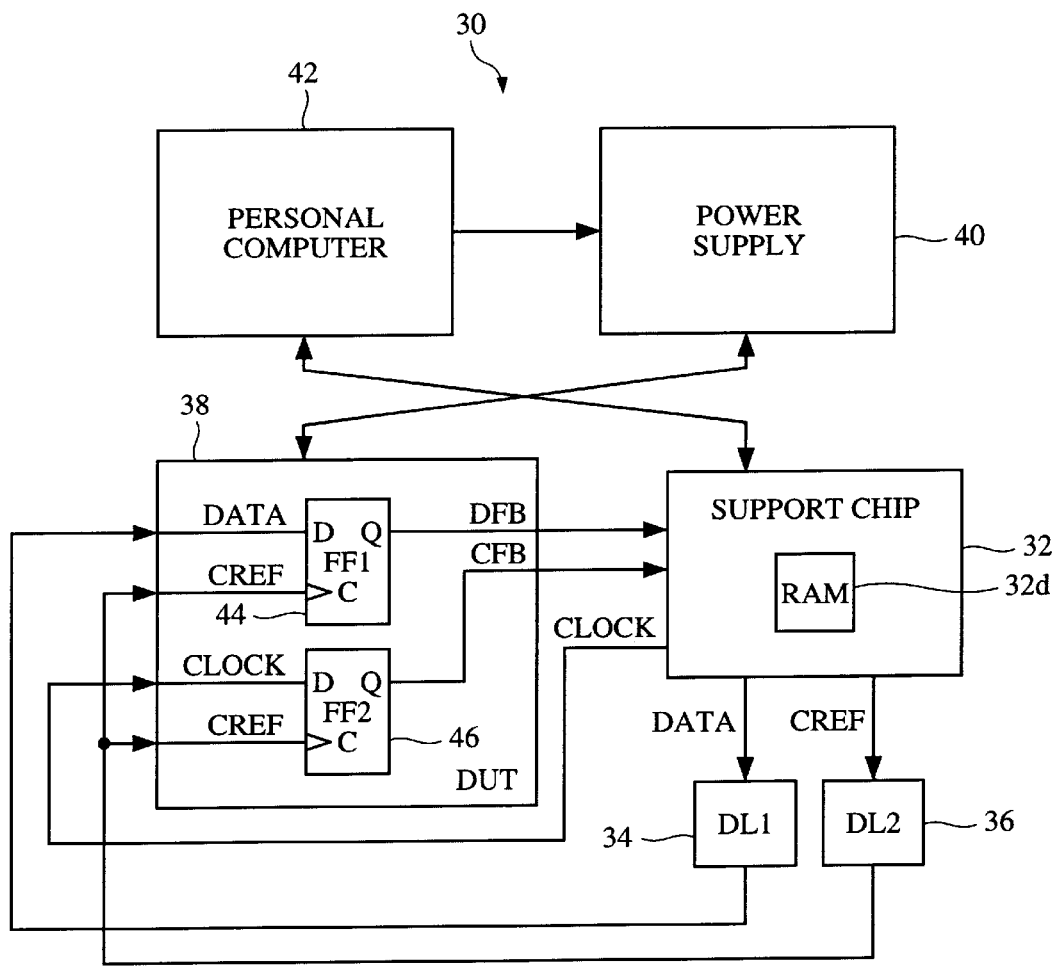
FIG. 15 is a diagram illustrating the apparatus of FIG. 13 in which a microelectronic device being tested is reconfigured for the scanning operation of FIGS. 9 to 11.

Note that the delay line 36 is not used in the step of the method illustrated in FIG. 13, but is used in another method illustrated and described in reference to FIG. 15. The support chip 32 applies fixed CLOCK pulses to the clock input of the element 44 as described above with reference to FIGS. 2 to 4. The chip 32 initially applies DATA pulses to the data input of the element 44 with a short delay which is sufficient to ensure that the element 44 will produce OUTPUT pulses as illustrated in FIG. 2. This is accomplished by programming the delay line 34 to delay the DATA pulses by a small length of time.

Figure 3:
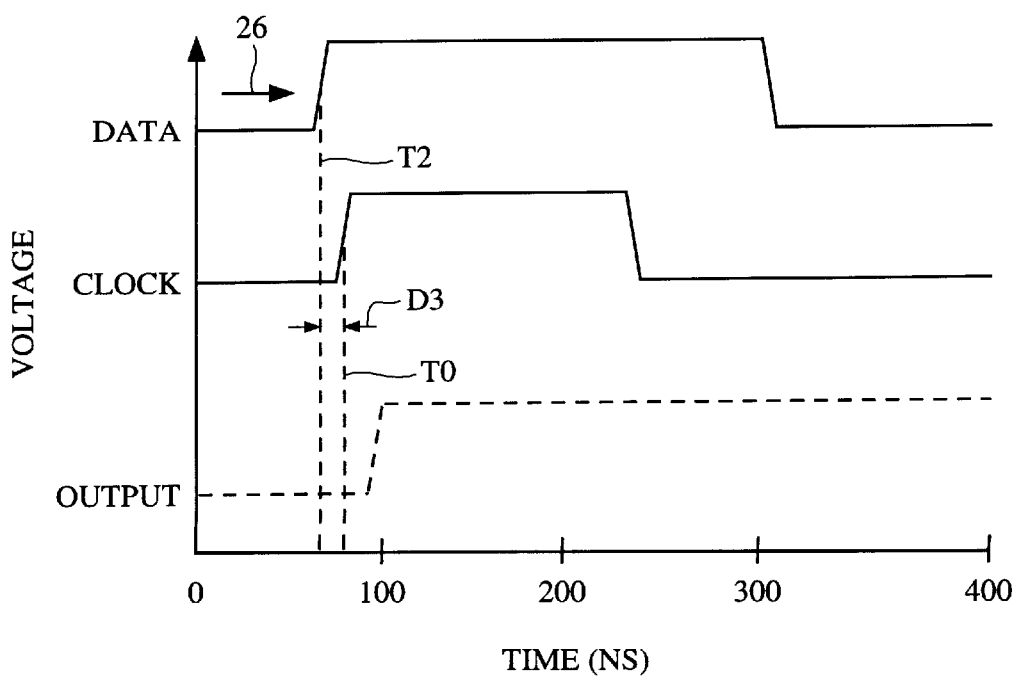

The support chip 32 repeatedly applies first or CLOCK pulses and second or DATA pulses to the element 44. The delay setting circuitry 32a in the chip 32 controls the delay line 34 to progressively increase the delay of the DATA pulses until the OUTPUT pulses disappear as illustrated in FIG. 3. The presence or absence of the output pulses can be easily sensed by the delay setting circuitry 32a by performing, for example, a logical XOR operation on the DATA line from the support chip 32 and the OUTPUT pulse line from the element 44. DFB in FIG. 15 and OUTPUT in FIG. 13 are physically the same connection.

Figure 4:
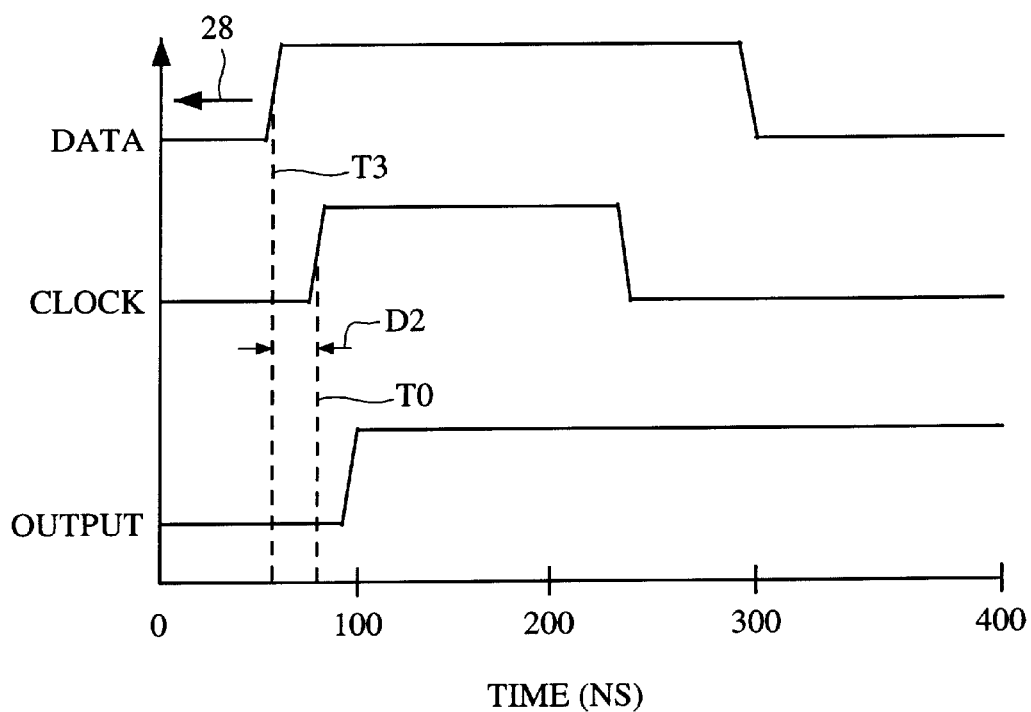

The delay setting circuitry 32a then controls the delay line 34 to progressively decrease the delay of the DATA pulses until the OUTPUT pulses reappear as illustrated in FIG. 4. At this point, the delay line 34 will have a digital value corresponding to the relative time T3.

However, the setup time D2 is not known at this point because only the difference between the relative time T1 (see FIG. 2) and the relative time T3 (see FIG. 4) can be determined. Relative time T1 corresponds to the initial delay value in the delay line 34 whereas relative time T3 corresponds to the final delay value. This information does not enable computation of the setup time D2, which is the difference between the relative times T0 and T3.

Scanning Operation For Measuring Setup Time

The delay D2 (setup time) is determined and set in accordance with the present invention by scanning the element using the DATA and CLOCK pulses and also reference pulses CREF. To perform this operation, the configuration circuitry 32c reconfigures the element 44 so that the CREF pulses, which are generated by the chip 32, are applied to the clock input of the element 44 through the delay line 36 as illustrated in FIG. 15.

The configuration circuitry 32c also configures another or auxiliary element 46 of the device 38 as a D-type flip-flop, having a data input D connected to receive the CLOCK pulses from the output of the chip 32, a clock input C connected to receive the CREF pulses from the output of the delay line 36, and a positive logic output Q connected to an input of the support chip 32. The outputs of the elements 44 and 46 are designated as a data feedback signal DFB and a clock feedback signal CFB respectively.

The scanning operation is performed by the scanning circuitry 32b, which sets up the delay line 34 to provide the same delay (delaying the DATA pulses by the relative time T3) that was established by the delay setting circuitry 32a at the end of the step illustrated in FIG. 4. Once set, the delay value provided by the delay line 34 for the DATA pulses is not changed.

Figure 9:
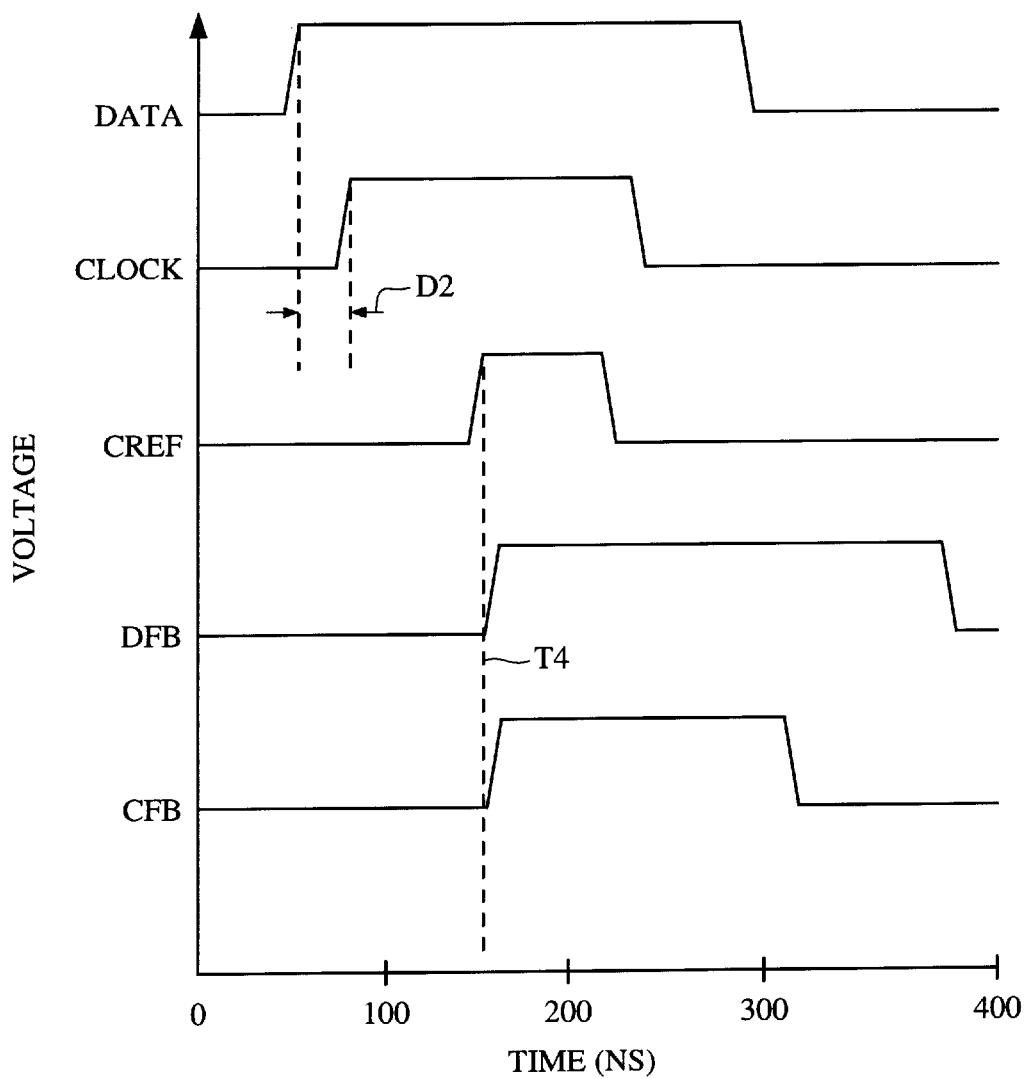
FIGS. 9 to 11 are timing diagrams illustrating a scanning operation according to the present invention.

Referring to FIGS. 9 and 15, if the setup times of the elements 44 and 46 are not violated (the references pulses CREF occur at a time after the minimum setup times of the DATA and CLOCK pulses), the elements 44 and 46 will produce the signals DFB and CFB at their Q outputs having leading edges which closely follow the leading edges of the CREF pulses.

As shown in FIG. 9, the reference pulse CREF is initially applied at a relative time T4 which is selected to ensure that both signals DREF and CREF will be generated. The delay line 36 will contain an 8-bit number designating one of its 256 delay steps which corresponds to the relative time T4.

Figure 10:
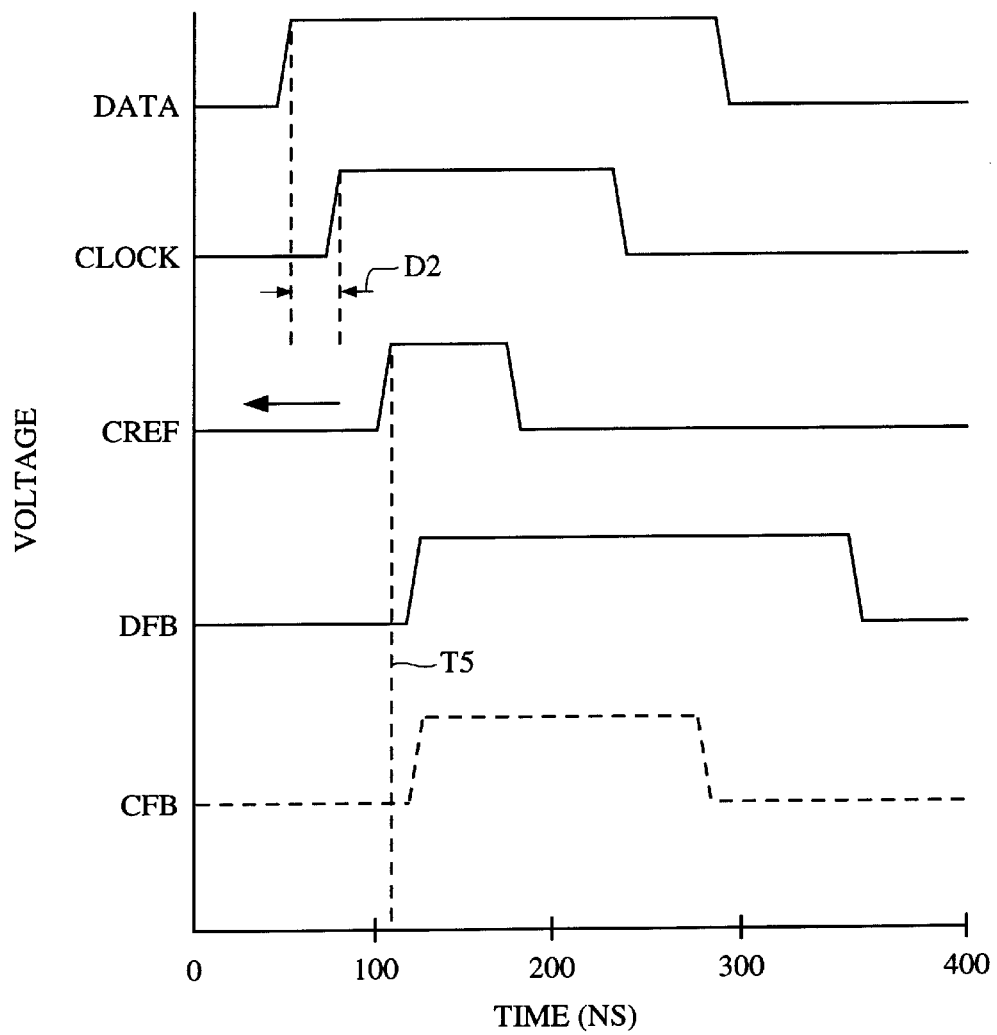

Referring to FIGS. 10, 14, and 15, the scanning circuitry 32b causes the DATA, CLOCK and CREF pulses to be repeatedly applied to the elements 44 and 46 with the delay of the CREF pulses being progressively decreased from the relative time T4. This method is accomplished by applying progressively smaller 8-bit numbers to the control port of the delay line 36.

Eventually, a transition point will be reached at which the length of time between the leading edges of the CLOCK and CREF pulses is smaller than the setup time of the element 46, and the clock feedback pulses CFB will no longer appear at the output Q of the element 46. This will occur at a relative time T5 as illustrated in FIG. 10, with the disappearance of the pulses CFB being indicated by the broken line. The scanning circuitry 32b stores the 8-bit number which is applied to the delay line 36 at this transition point and corresponds to the relative time T5.

Figure 11:
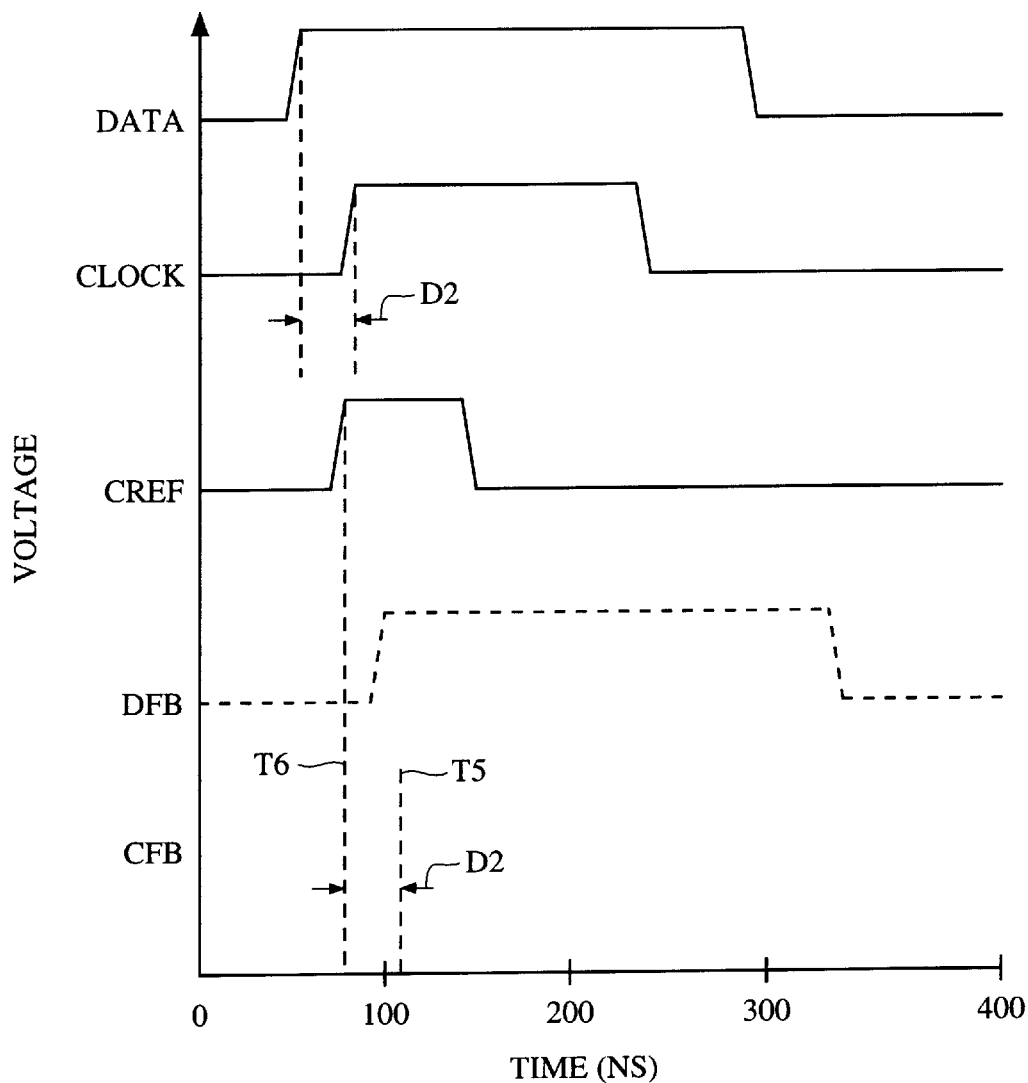

Referring to FIG. 11, the delay of the CREF pulses is further progressively decreased until the setup time of the element 44 is violated and the data feedback pulses DFB disappear as indicated by the broken line. This event occurs at a relative time T6. The scanning circuitry 32b stores the 8-bit number for the delay line 36 which corresponds to the relative time T6.

In a practical FPGA or similar microelectronic device of a type to which the present invention applies, it can be assumed that any differences between the setup and hold times for the individual elements are negligible for the purposes of performing the present test. Therefore, since the relative time or delay between the DATA and CLOCK pulses corresponds to the setup time D2 as set into the delay line 34, the relative time or delay between the relative times T5 and T6 will also be equal to D2.

The 8-bit numbers for the delay line 36 are known for the relative times T5 and T6. The setup time D2 therefore corresponds to the difference between these numbers, more specifically to the product of the difference and the step size. The scanning circuitry 32b calculates this value and thereby obtains an accurate measurement of the setup time. For example, if the 8-bit number corresponding to the relative time T5 is equal to decimal 124 and the number corresponding to the relative time T6 is equal to decimal 96, the setup time D2 will be equal to (124−96)×0.25 ns=7 ns.

Summary of Setup Time Measurement and Variations

The present method and apparatus as described above performs two main operations to determine the setup time for the element 44. The first operation, as illustrated in FIGS. 2–4 and 13, produces an 8-bit number corresponding to the setup time D2 which is set into the delay line 34. The second operation, as illustrated in FIGS. 9–11 and 15, reconfigures the device 38 and performs a scanning operation with the DATA signals delayed by the value determined in the first operation to obtain a numerical output of the setup time.

As shown above, the hold times for the different configurations of pulse edges and data levels are equivalent to corresponding setup times and do not have to be measured separately. However, the present invention is equivalently capable of measuring hold times.

This measurement can be accomplished by progressively decreasing the delay of the DATA pulses relative to the CLOCK pulses until the hold time is violated and the OUTPUT pulses disappear, and then increasing the delay until the OUTPUT pulses reappear. This step determines a delay value for the delay line 34 corresponding to the hold time. Then, the scanning operation is performed by decreasing the delay of the CREF pulses until the CLOCK pulses, and then the DATA pulses, disappear to obtain a numerical value for the hold time D2.

Operational Constraints

Figure 12:
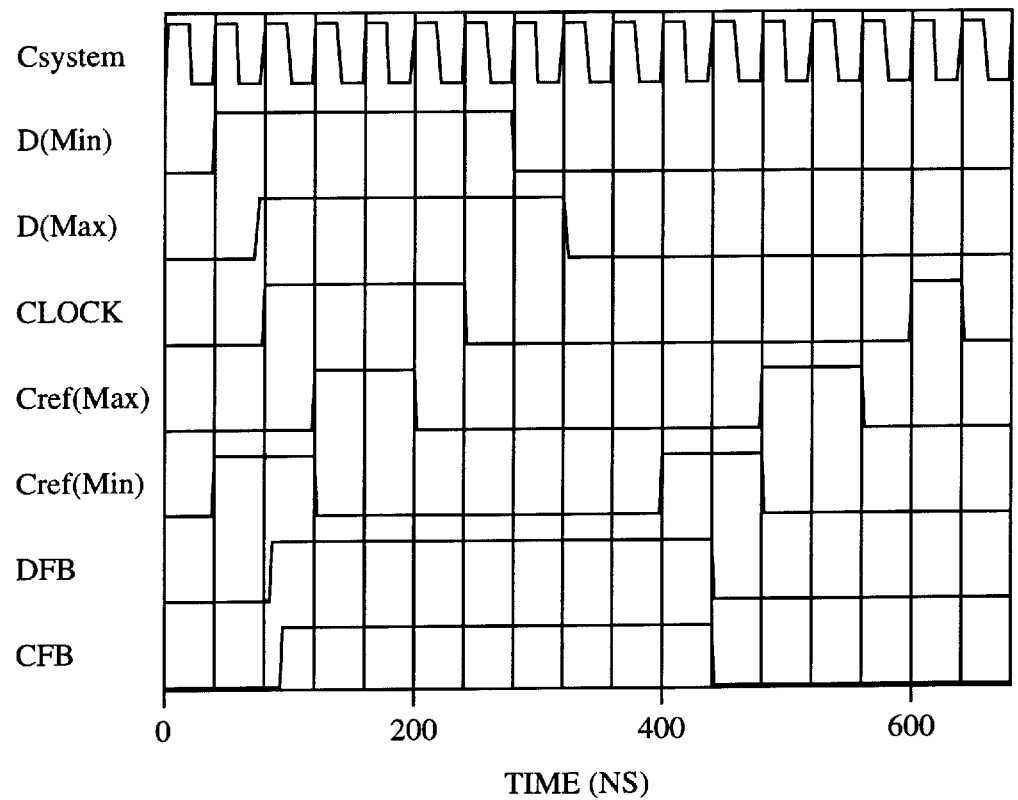
FIG. 12 is a timing diagram illustrating the required relationship between the signals according to the invention.

In order for the present method to function properly, there must be various relationships between signals as illustrated in FIG. 12. The following nomenclature is used for the signals. It will be noted that two CLOCK pulses are generated for each DATA signal. The first CLOCK pulse clocks in the DATA signal to produce a corresponding OUTPUT pulse, and the second CLOCK pulse resets the element under test.

Csystem=System clock signal
CLOCK=Clock signal
DATA =Data signal
D(Min) DATA signal at minimum delay
D(Max) DATA signal at maximum delay
CREF=Reference clock signal
Cref(Min) CREF at minimum delay
Cref(Max) CREF at maximum delay
CFB=Clocked-in clock signal or clock feedback
DFB=Clocked-in data signal or data feedback The constraints themselves are as follows. The reference clock signal CREF is central to determining the delay between the DATA and CLOCK signals. CREF is automatically generated by the support chip 32 along with the DATA and CLOCK signals. The relationship between the 3 signals is detailed below.

CREF at minimum delay and maximum delay are shown in FIG. 12. Cref (Min) and Cref (Max) are really the same signal at different times. Similarly, D(Max) and D(Min) are the DATA signal at minimum delay and maximum delay. Specifications for CREF with respect to other signals are as follows:

1. There are two CREF pulses for each DATA pulse or two CLOCK pulses. CREF, DATA and CLOCK are synchronized to the same system clock, Csystem.
2. At maximum delay, on the leading edge of its first pulse, CREF must clock in DATA/CLOCK to produce DFB and CFB, respectively. In other words, DATA/CLOCK to CREF delay must be much larger than the DATA/CLOCK to CREF minimum setup time.
3. At minimum delay, on the leading edge of its first pulse, CREF must not clock in DATA/CLOCK. In other words, DATA/CLOCK to CREF minimum setup time must be violated then.

4. At maximum delay, on the trailing edge of CREF's first pulse, DATA/CLOCK must maintain the same logic level as when it is clocked in by CREF and DFB/CFB must be available and stable.

5. The pulse widths of DATA and CLOCK must be longer than the pulse width of CREF. The trailing edge of DATA and CLOCK must be after the trailing edge of CREF.

6. On the leading edge of its second pulse, CREF must clear DFB/CFB. On the trailing edge of the pulse, both DATA/CLOCK and DFB/CFB must have been cleared and stable.

7. The initial distance between DATA and CLOCK must be less than the maximum delay range of the delay line chip.

8. The initial distance between CLOCK and Cref(Max) must be less than the maximum delay range of the delay line chip.

9. The pulse width of CREF must be greater than the maximum delay range otherwise the minimum pulse width requirement for the delay line chip may be violated at maximum delay.

10. The leading edge of CLOCK should be aligned with the center of the Cref(Min) pulse to take full advantage of the maximum delay range of the delay line chip.

Multiple Measurement Operation

The method of the present invention as described above obtains one setup time measurement for one element. However, it is necessary to perform more than one test, for example 12 measurements for each pin of each element, for the different sets of pulse edge, data level and supply voltage parameters. If the method were performed as described above individually for each element, it would be necessary to first configure for delay setting operation (FIG. 13) and then reconfigure for scanning operation (FIG. 15) the device for performing each of the 12 tests, thereby consuming an excessive and unnecessary amount of time.

For this reason, the RAM 32d (FIG. 13) is provided and utilized to minimize the number of times the device must be reconfigured. More specifically, the delay value corresponding to the setup time for the DATA pulses (8-bit number for the delay line 34) is obtained for each set of test parameters. After each test is performed, the delay line value is stored in the RAM 32d. The device is not reconfigured (see FIG. 15) until the delay line values for all of the test parameters (e.g. 12 sets of test parameters for each pin) have been obtained and stored in the RAM 32d.

Then, the scanning operation for each test is performed. The device is reconfigured only once. For each scanning operation for a given set of test parameters, the corresponding delay line value is retrieved from the RAM 32d and set into the delay line 34. The scanning operation is then performed, and the resulting value of setup time stored in the RAM 32d. Alternatively, the resulting value can be sent to a personal computer directly via the parallel port, serial port, USB (universal signal bus), firewire, etc. This method is repeated for each set of test parameters. Thus, the RAM 32d enables any number of tests to be performed on an element with the element having to be reconfigured only once.

Programmed Support Circuitry

Figure 16:
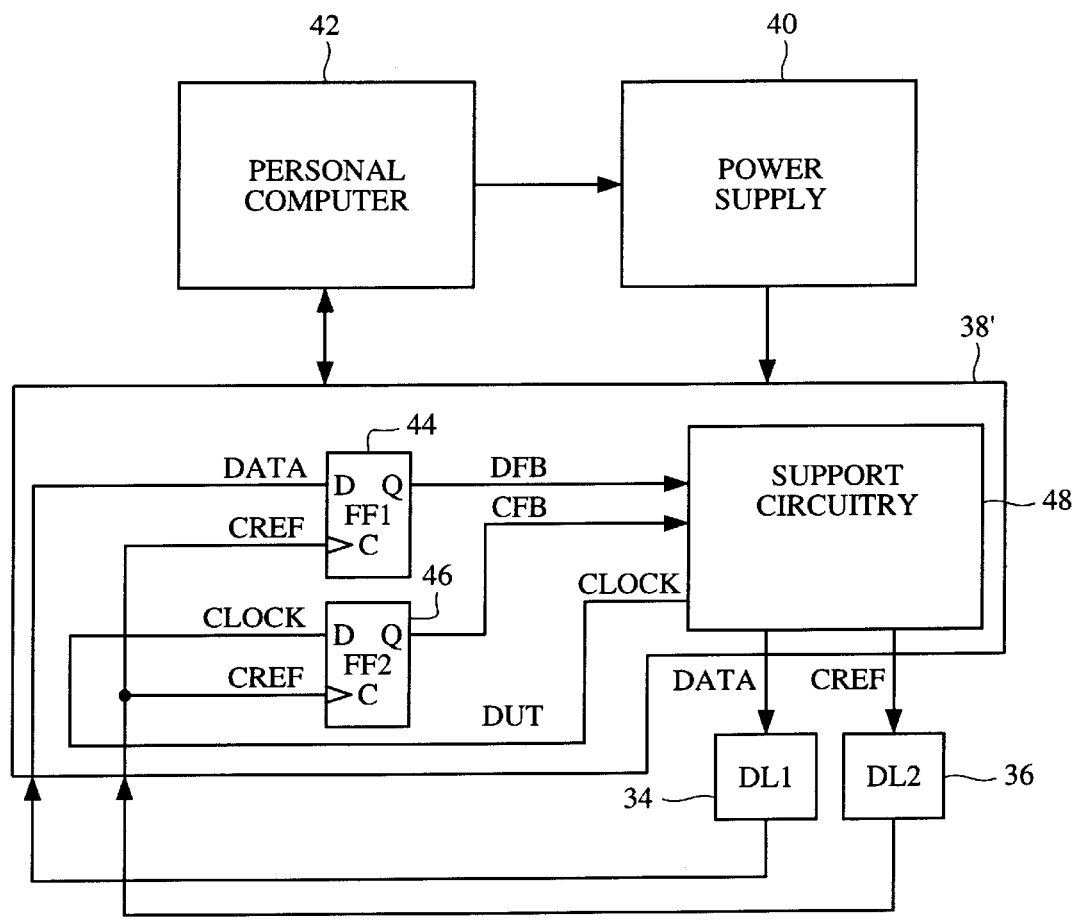
FIGS. 16 and 17 are diagrams illustrating alternative configurations of the present testing apparatus.

In another embodiment of the present invention, the support circuitry 48 includes at least one of the delay setting circuitry 32a, scanning circuitry 32b, configuration circuitry 32c and RAM 32d to be part of the device under test itself as indicated by device 38' in FIG. 16.

This is possible since the device 38' includes a large number of configurable elements which can be programmed to implement the functionality of the support circuitry 48. In this embodiment of the invention, the delay line values are stored in the personal computer 42 (instead of RAM) for the delay setting operation of FIG. 13. The delay values are then retrieved from the computer 42 for the scanning operation of FIG. 15. Communication with the personal computer can be done via the parallel port, serial port, USB (universal serial bus), firewire, etc.

Figure 17:
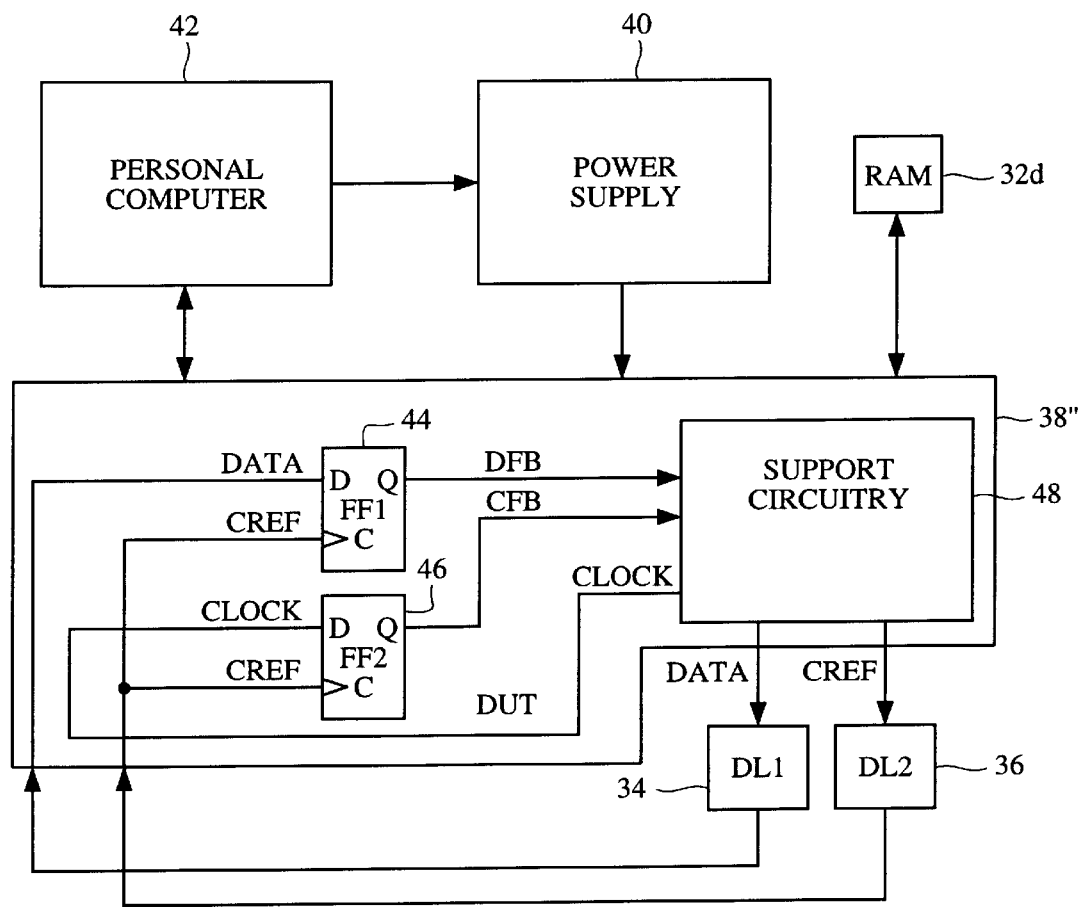

As another alternative, illustrated in FIG. 17, the device 38" can be configured to implement the functionality of the support circuitry 48 with a small RAM 32d provided as a separate hardware unit.

Alternative Time Difference Measurements

As presented above, the present method and apparatus are capable of measuring setup and hold times in a microelectronic device. These measurements determine the time difference between two input signals. The invention is also capable of measuring time differences between an input signal and an output signal, or between two output signals. The time difference in the latter case will be caused by different capacitive loadings on the output pins at which the signals appear.

Figure 18:
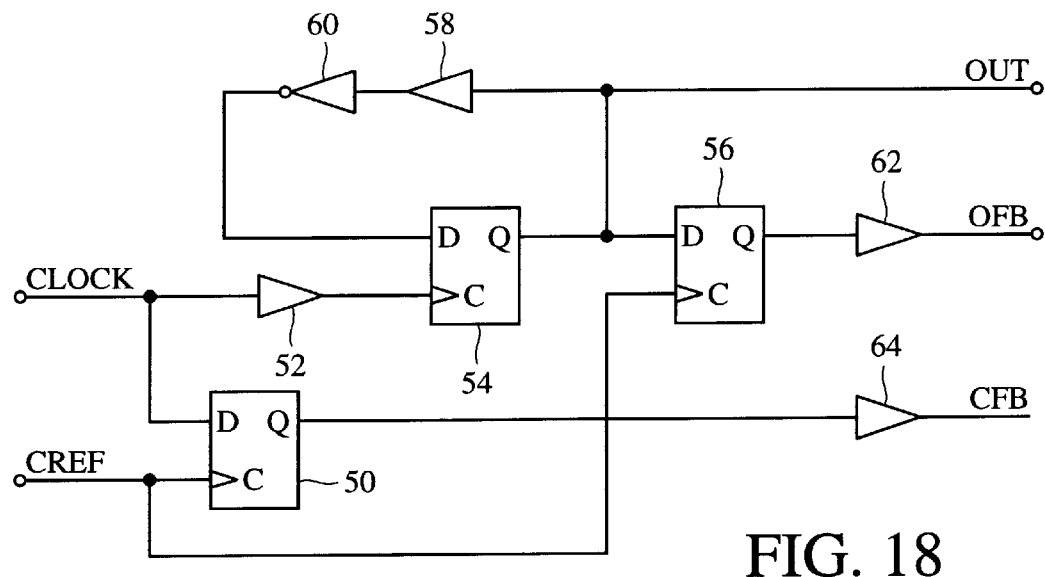
FIGS. 18 and 19 are electrical schematic diagrams illustrating elements of a microelectronic device configured to measure a time difference between an input signal and an output signal.

FIG. 18 illustrates how a device can be configured to measure a time difference between an input signal, in this case CLOCK pulses, and an output signal OUT which is generated in response to the CLOCK pulses. The configuration includes a first D-type flip-flop 50 having a D input terminal receiving the CLOCK pulses and a clock input terminal C receiving reference pulses CREF.

The CLOCK pulses are also applied through a buffer 52 to the clock input terminal C of a flip-flop 54. The Q output terminal of the flip-flop 54 is connected to the D input terminal of a flip-flop 56 as well as to the D input terminal of flip-flop 54 through a negative feedback loop including a buffer 58 and an inverter 60.

The output signal OUT appears at the Q output terminal of the flip-flop 54, whereas output and clock feedback signals OFB and CFB are generated at the Q output terminals of the flip-flops 56 and 50 and appear at the output terminals of buffers 62 and 64 respectively.

The flip-flop 54 acts as a toggle for the output signal OUT due to the provision of the negative feedback loop including the inverter 60. The flip-flop 54 changes the logic level of the output signal OUT in response to each rising edge of a CLOCK pulse. If the inverter 60 were not present, the output signal would remain at the same logic level. It is desired to measure the length of time required for the output signal OUT to change after a CLOCK pulse is applied.

The time difference between input signal CLOCK and the output signal OUT is measured using the scanning operation described above with reference to FIGS. 9–11. The CREF pulses are initially delayed sufficiently to ensure that the feedback signals OFB and CFB will be produced. Then, the delay is progressively reduced until the signal OFB disappears, and then the signal CFB disappears. The delay difference between these two transition points is used to calculate the time difference (e.g. D2) in the manner described above with reference to FIGS. 9–11.

Figure 19:
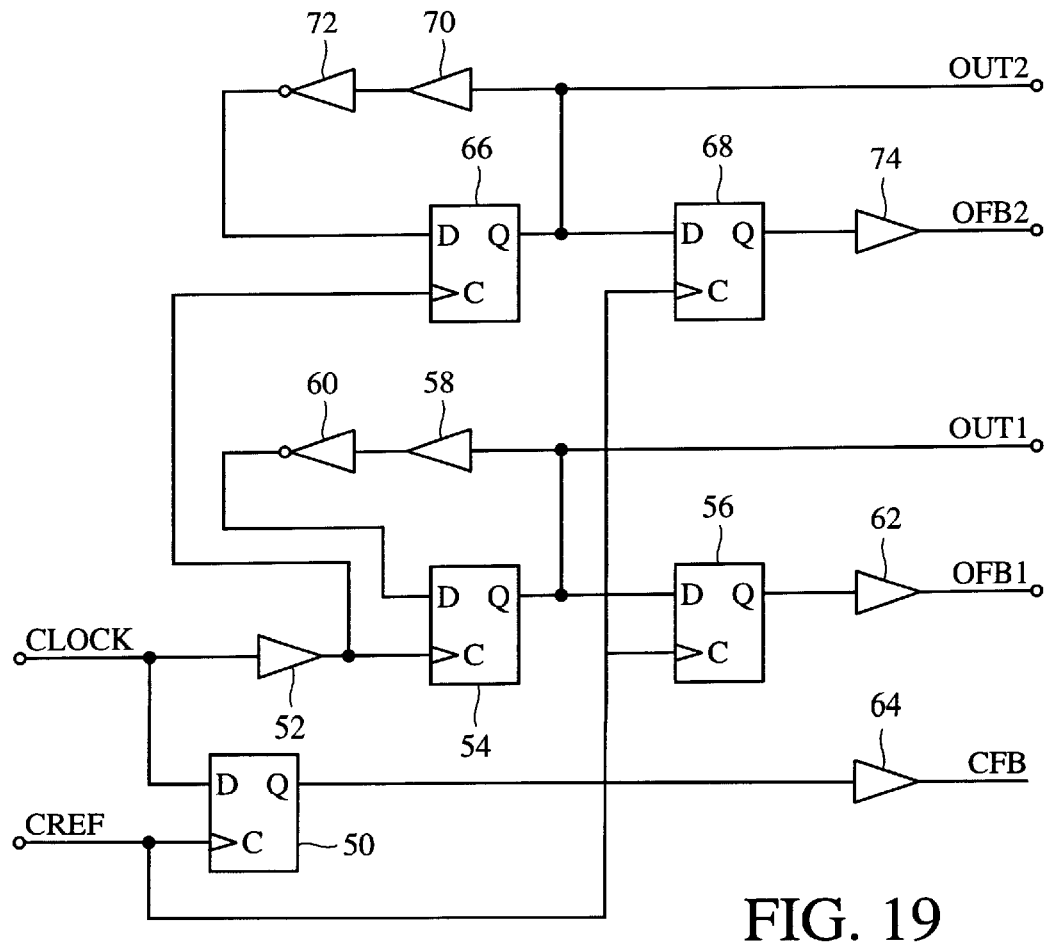

FIG. 19 illustrates how the present invention can be used to measure the time differences between more than two signals. In this case, the embodiment of FIG. 18 is expanded to include additional flip-flops 66 and 68 as well as buffers 70, 72, and 74. These new elements are connected in a manner similar to elements 52, 54, 56, 58, 60, and 62. Note that in this embodiment, an output signal OUT1 appears at the Q output terminal of the flip-flop 54, whereas an output signal OUT2 appears at the Q output terminal of the flip-flop 66. In a similar manner, the output and clock feedback signals OFB1 and CFB are generated at the Q output terminals of the flip-flops 56 and 50 and appear at the output terminals of buffers 62 and 64 respectively, whereas the output feedback signal OFB2 is generated at the Q output terminal of the flip-flop 68 and appears at the output terminal of buffer 74. In this configuration, the output signal OUT2 is monitored by the flip-flop 68 and buffer 74 and the output signal OUT1 is monitored by the flip-flop 56 and the buffer 62.

The signals CFB, OFB1 and OFB2 will disappear at delays of the signal CREF corresponding to their relative timings. The signals to be compared can be selected by any suitable configuration of logic circuitry connected to receive these output signals.

Figure 20:
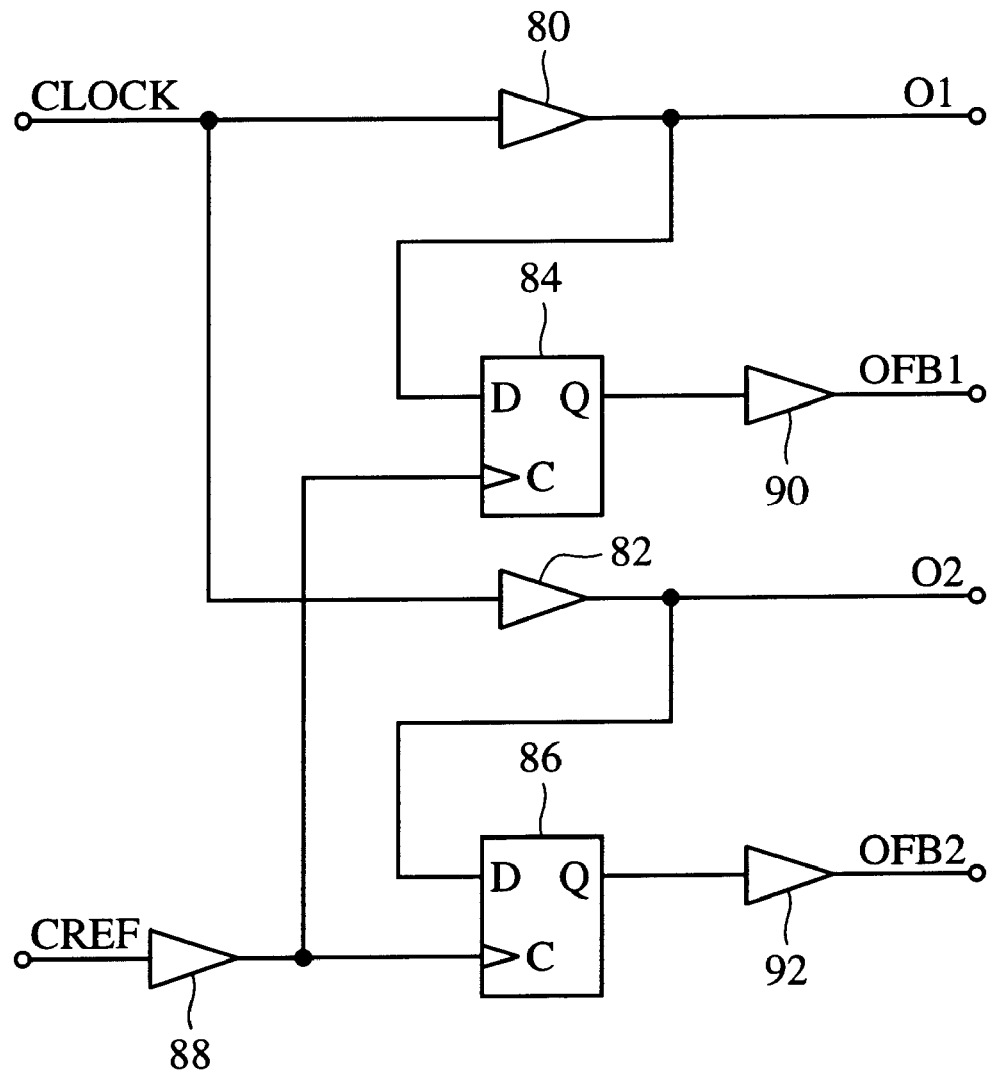
FIGS. 20 and 21 are electrical schematic diagrams illustrating elements of a microelectronic device configured to measure a time difference between two output signals caused by different capacitive loading of corresponding output pins.

FIG. 20 illustrates how the present invention can be used to measure a time difference between two output signals O1 and O2 which are generated in response to input CLOCK pulses. The time difference will be caused by different capacitive loadings at output pins (not shown) at which the signals appear. The time difference between two output signals can also be caused by other factors such as slew rates, different physical internal routes from the input pin (e.g. CLOCK in FIG. 20) to the output pins (e.g. O1, O2 in FIG. 20) and the activities of the pins adjacent to the pins being measured.

The CLOCK pulses are applied continuously to buffers 80 and 82, and constitute the output signals O1 and O2 at the outputs of the buffers 80 and 82 which are applied to the D input terminals of flip-flops 84 and 86. The CREF pulses are applied through a buffer 88 to the clock input terminals of the flip-flops 84 and 86. Output feedback signals OFB1 and OFB2 appear at the output terminals of buffers 90 and 92 which have input terminals connected to the Q output terminals of the flip-flops 84 and 86. Although the flip-flops 84 and 86 are driven together by the CLOCK pulses, there will be a time difference between the output signals O1 and O2 due to the capacitive loading of the output pins to which they are connected. This time difference is reflected at the input terminals of the flip-flops 84 and 86, which are scanned using the reference pulses CREF in the manner described above. The delay difference between the feedback signals OFB1 and OFB2 corresponds to the time difference between the output signals O1 and O2.

Figure 21:
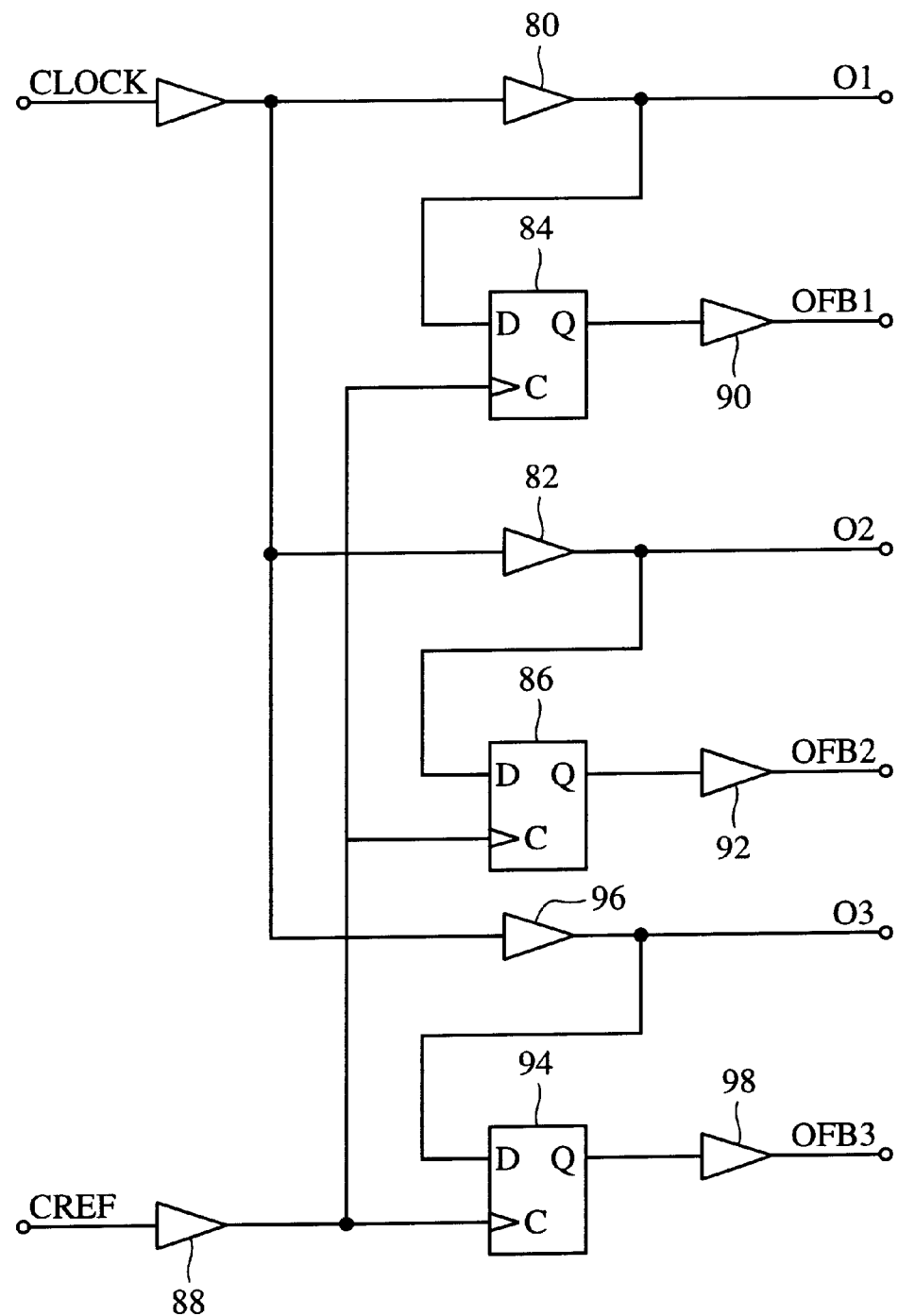
Figure 22:
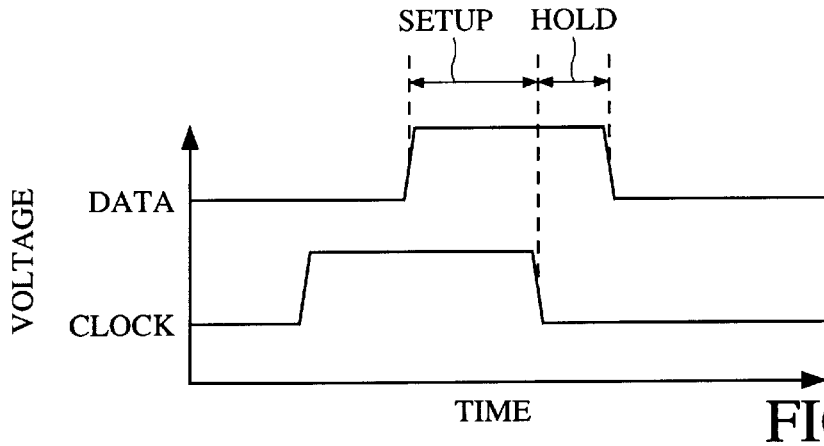
FIGS. 22 to 25 are timing diagrams illustrating relationships between setup and hold times for different configurations of pulse edges and data levels for a data latch.
Figure 23:
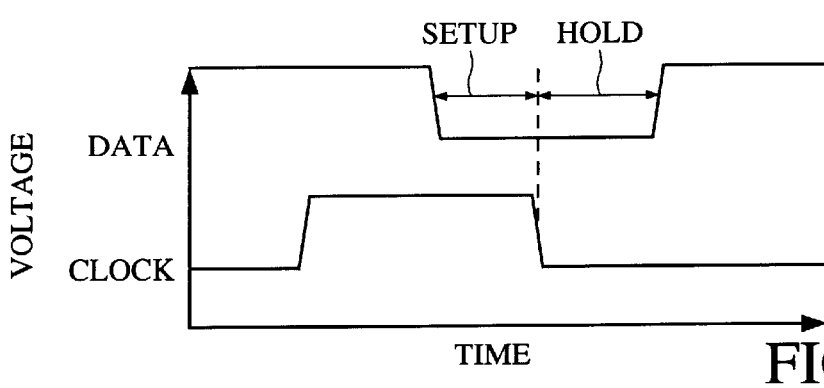
Figure 24:
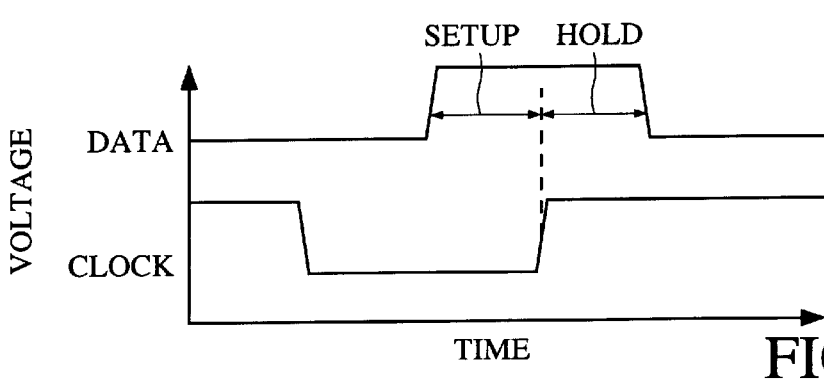
Figure 25:
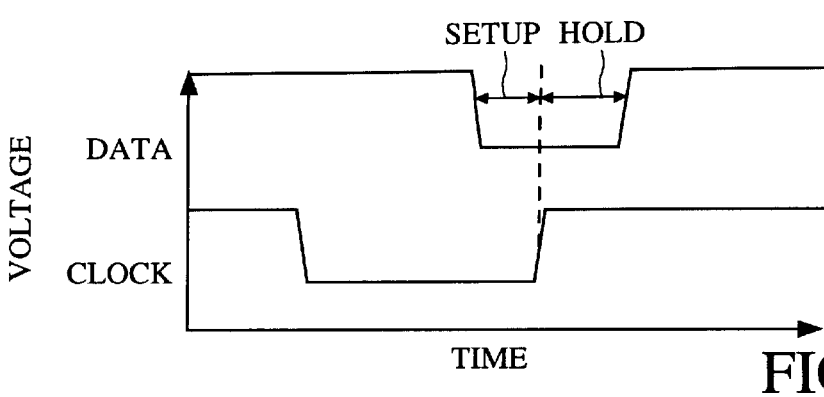

FIG. 21 is similar to FIG. 20, but illustrates a configuration including an additional flip-flop 94 and buffers 96 and 98 for measuring time differences between three output signals O1, O2 and O3. In general, the invention can be applied to measure time differences between any number of input and output signals in any configuration.

In the embodiments of the invention described above, the elements in the microelectronic device have been configured as D-type flip-flops, which are edge triggered devices. However, the invention is also applicable to a level-triggered device such as a data latch, in which the clock pulse is applied to a gate input rather than a clock input.

FIGS. 22–25 illustrate the setup and hold time relationships for the four signal levels in a data latch. The principles are essentially similar to those of a flip-flop, except that the latch is clocked by the trailing edge of a CLOCK pulse rather than the leading edge as is the case with a D-type flip-flop.

The same methodology described above is used to measure the setup and hold times for a latch. To measure setup time, the delay of the DATA signal is progressively increased until the OUTPUT signal disappears, and then progressively decreased until it reappears. To measure hold time, the DATA signal is progressively decreased until the OUTPUT signal disappears, and then progressively increased until it reappears. Various modifications will become possible for those skilled in the art after receiving the teachings of the present disclosure without departing from the scope thereof. For example, the scanning operation in any of the embodiments of the invention can be performed in the reverse direction to that described with reference to FIG. 9–11. More specifically, the delay of the pulses CREF is initially set so low that none of the elements will produce an output. Then, the delay is progressively increased until the elements sequentially produce outputs depending on their relative timing.

What is claimed is:

1. A method for testing an element of a microelectronic device which produces an output in response to a first edge of a first pulse which is applied more than a minimum length of time after a second edge of a second pulse, comprising the steps of:

(a) repeatedly applying first and second pulses to the element with a delay of the second edge relative to the first edge being progressively changed from a first value until a second value corresponding to the minimum length of time is reached as indicated by a transition between the output being produced and the output not being produced; and (b) scanning the element using the first and second pulses and reference pulses with the delay set at the second value to determine the minimum length of time.

2. A method as in claim 1, in which:

the element is configured as a flip-flop;

the first pulse is a clock pulse;

the first edge is a leading edge of the clock pulse;

the second pulse is a data pulse;

the second edge is a leading edge of the data pulse; and the minimum length of time is a setup time of the flip-flop.

3. A method as in claim 1, in which:

the element is configured as a flip-flop;

the first pulse is a clock pulse;

the first edge is a leading edge of the clock pulse;

the second pulse is a data pulse;

the second edge is a trailing edge of the data pulse; and the minimum length of time is a hold time of the flip-flop.

4. A method as in claim 1, in which:

the element is configured as a latch;

the first pulse is a clock pulse;

the first edge is a trailing edge of the clock pulse;

the second pulse is a data pulse;

the second edge is a leading edge of the data pulse; and the minimum length of time is a setup time of the latch.

5. A method as in claim 1, in which:

the element is configured as a latch;

the first pulse is a clock pulse;

the first edge is a trailing edge of the clock pulse;

the second pulse is a data pulse;

the second edge is a trailing edge of the data pulse; and the minimum length of time is a hold time of the latch.

6. A method as in claim 1, in which the output is produced at the first value.

7. A method as in claim 1, in which the output is not produced at the first value.

8. A method as in claim 1, in which:

the output is produced at the first value: and step (a) comprises the substeps of:
- (a1) repeatedly applying first and second pulses to the element with the delay of the second edge being progressively increased from the first value until a third value is reached at which the output is not produced; and
- (a2) repeatedly applying first and second pulses to the element with the delay of the second edge being progressively decreased from the third value until the second value is reached as indicated by the output being produced.

9. A method as in claim 1, in which:

the element is configurable; and the method further comprises the step, performed before step (a), of:
- (c) configuring the element such that it will produce an output in response to the first edge being applied thereto more than the minimum length of time after the second edge.

10. A method as in claim 9, in which step (c) comprises configuring the element as including a flip-flop.

11. A method as in claim 9, in which step (c) comprises configuring the element as including a latch.

12. A method as in claim 9, in which step (c) comprises configuring the element as including a D-type flip-flop with the first pulses being applied to a clock input and the second pulses being applied to a data input thereof.

13. A method as in claim 9, in which:

the device comprises an auxiliary element which is configurable; and step (b) comprises the substeps of:
- (b1) re-configuring the element to produce a first output in response to a reference edge of a reference pulse which is applied thereto more than the minimum length of time after the second edge;
- (b2) configuring the auxiliary element to produce a second output in response to the reference edge being applied thereto more than the minimum length of time after the first edge;
- (b3) repeatedly applying first, second and reference pulses to the element and to the auxiliary element with the delay of the reference edge being progressively decreased from a third value at which the first and second outputs are produced to a fourth value at which one of the first and second outputs is produced and the other of the first and second outputs is not produced;
- (b4) repeatedly applying first, second and reference pulses to the element and to the auxiliary element with the delay of the reference edge being progressively decreased from the fourth value to a fifth value at which the first and second outputs are not produced; and
- (b5) calculating the minimum length of time as a corresponding to a difference between the fourth and fifth values.

14. A method as in claim 13, in which:

step (b1) comprises re-configuring the element as including a D-type flip-flop with the reference pulse being applied to a clock input and the second pulses being applied to a data input thereof; and step (b2) comprises configuring the auxiliary element as including a D-type flip-flop with the reference pulses being applied to a clock input and the first pulses being applied to a data input thereof.

15. A method as in claim 13, further comprising the steps, performed between steps (a) and (b), of:
- (c) storing the second value;
- (d) repeating step (a) for different first and second pulses to obtain a different second value;
- (e) storing the different second value;

in which step (b) is performed using the second value which was stored in step (c);

the method further comprising the step, performed after step (b), of:
- (f) repeating step (b) using the different second value which was stored in step (e).

16. A method for measuring a time difference between a first edge of a first pulse and a second edge of a second pulse in a configurable microelectronic device, comprising the steps of:
- (a) configuring the device to include a first element which produces a first output in response to the first edge being applied thereto more than a minimum length of time before a reference edge of a reference pulse;
- (b) configuring the device to include a second element which produces a second output in response to the second edge being applied thereto more than the minimum length of time before the reference edge of a reference pulse;
- (c) repeatedly applying first, second and reference pulses to the first and second elements with the delay of the reference edge being progressively decreased from a first value at which the first and second outputs are produced to a second value at which the one of the first and second outputs is produced and the other of the first and second outputs is not produced;
- (d) repeatedly applying first, second and reference pulses to the first and second elements with the delay of the reference edge being progressively decreased from the second value to a third value at which the first and second outputs are not produced; and
- (e) calculating the time difference as a difference between the second and third values.

17. A method as in claim 16, in which the first and second pulses are input pulses.

18. A method as in claim 17, in which:

step (a) comprises configuring the first element as including a D-type flip-flop with the reference pulses being applied to a clock input and the first pulses being applied to a data input thereof; and step (b) comprises configuring the second element as including a D-type flip-flop with the reference pulses being applied to a clock input and the second pulses being applied to a data input thereof.

19. A method as in claim 16, in which the first pulse is an input pulse and the second pulse is an output pulse.

20. A method as in claim 19, in which:

step (a) comprises configuring the first element as including a first D-type flip-flop with the reference pulses being applied to a clock input and the first pulses being applied to a data input thereof; and step (b) comprises configuring the second element as including a second D-type flip-flop with the reference pulses being applied to a clock input thereof, and a third D-type flip-flop with the first pulses applied to a clock input thereof, an output being connected to a data input of the second D-type flip-flop, and the output pulses being applied through an inverter to a data input of the third D-type flip-flop.

21. A method as in claim 16, in which the first and second pulses are output pulses.

22. A method as in claim 21, in which:
   step (a) comprises configuring the first element as including a D-type flip-flop with the reference pulse being applied to a clock input and the first pulses being applied to a data input thereof; and
   step (b) comprises configuring the second element as including a D-type flip-flop with the reference pulse being applied to a clock input and the second pulses being applied to a data input thereof.

23. An apparatus for testing an element of a microelectronic device which produces an output in response to a first edge of a first pulse which is applied more than a minimum length of time after a second edge of a second pulse, comprising:
   delay setting circuitry for repeatedly applying first and second pulses to the element with a delay of the second edge relative to the first edge being progressively changed from a first value until a second value corresponding to the minimum length of time is reached as indicated by a transition between the output being produced and the output not being produced; and
   scanning circuitry for scanning the element using the first and second pulses and reference pulses with the delay set at the second value to determine the minimum length of time.

24. An apparatus as in claim 23, in which:
   the element is configured as a flip-flop;
   the first pulse is a clock pulse;
   the first edge is a leading edge of the clock pulse;
   the second pulse is a data pulse;
   the second edge is a leading edge of the data pulse; and
   the minimum length of time is a setup time of the flip-flop.

25. An apparatus as in claim 23, in which:
   the element is configured as a flip-flop;
   the first pulse is a clock pulse;
   the first edge is a leading edge of the clock pulse;
   the second pulse is a data pulse;
   the second edge is a trailing edge of the data pulse; and
   the minimum length of time is a hold time of the flip-flop.

26. An apparatus as in claim 23, in which:
   the element is configured as a latch;
   the first pulse is a clock pulse;
   the first edge is a trailing edge of the clock pulse;
   the second pulse is a data pulse;
   the second edge is a leading edge of the data pulse; and
   the minimum length of time is a setup time of the latch.

27. An apparatus as in claim 23, in which:
   the element is configured as a latch;
   the first pulse is a clock pulse;
   the first edge is a trailing edge of the clock pulse;
   the second pulse is a data pulse;
   the second edge is a trailing edge of the data pulse; and
   the minimum length of time is a hold time of the latch.

28. An apparatus as in claim 23, in which the output is produced at the first value.

29. An apparatus as in claim 23, in which the output is not produced at the first value.

30. An apparatus as in claim 23, in which:
   the output is produced at the first value:
   the delay setting circuitry repeatedly applies first and second pulses to the element with the delay of the second edge being progressively increased from the first value until a third value is reached at which the output is not produced; and
   the delay setting circuitry further repeatedly applies first and second pulses to the element with the delay of the second edge being progressively decreased from the third value until the second value is reached as indicated by the output being produced.

31. An apparatus as in claim 23, in which the element is configured such that it will produce an output in response to the first edge being applied thereto more than the minimum length of time after the second edge.

32. An apparatus as in claim 31, in which the element is configured as a flip-flop.

33. An apparatus as in claim 31, in which the element is configured as a latch.

34. An apparatus as in claim 31, in which the element is configured as a D-type flip-flop with the first pulses being applied to a clock input and the second pulses being applied to a data input thereof.

35. An apparatus as in claim 31, further comprising configuration circuitry for re-configuring the element to produce a first output in response to a reference edge of a reference pulse which is applied thereto more than the minimum length of time after the second edge; and for configuring the auxiliary element to produce a second output in response to the reference edge being applied thereto more than the minimum length of time after the first edge;
   in which the scanning circuitry repeatedly applies first, second and reference pulses to the element and to the auxiliary element with the delay of the reference edge being progressively decreased from a third value at which the first and second outputs are produced to a fourth value at which one of the first and second outputs is produced and the other of the first and second outputs is not produced;
   the scanning circuitry further repeatedly applies first, second and reference pulses to the element and to the auxiliary element with the delay of the reference edge being progressively decreased from the fourth value to a fifth value at which the first and second outputs are not produced; and
   the scanning circuitry further calculates the time difference as corresponding to a difference between the fourth and fifth values.

36. An apparatus as in claim 35, in which the configuration circuitry re-configures the element as including a D-type flip-flop with the reference pulses being applied to a clock input and the second pulses being applied to a data input thereof; and configures the auxiliary element as including a D-type flip-flop with the reference pulses being applied to a clock input and the first pulses being applied to a data input thereof.

37. An apparatus as in claim 36, further comprising a memory, in which:
   the delay setting circuitry further stores the second value, obtains a different second value for different first and second pulses, and stores the different second value; and
   the scanning circuitry further retrieves the second value from the memory and scans the element using the first and second pulses with the delay set at the second value to obtain the minimum length of time; retrieves the different second value from the memory and scans the element using the different first and second pulses with the delay set at the different second value to obtain a different minimum length of time corresponding to the different first and second pulses.

38. An apparatus as in claim 37, in which the delay setting circuitry, the scanning circuitry and the memory are separate from the device.

39. An apparatus as in claim 37, in which:

the device is programmable; and at least one of the delay setting circuitry and the scanning circuitry is constituted by a programmed portion of the device.

40. An apparatus as in claim 39, in which the memory is separate from the device.

41. An apparatus as in claim 23, in which:

the device is programmable; and at least one of the delay setting circuitry and the scanning circuitry is constituted by a programmed portion of the microelectronic device.

42. An apparatus for measuring a time difference between a first edge of a first pulse and a second edge of a second pulse in a microelectronic device, comprising:

configuration circuitry for configuring the device to include a first element which produces a first output in response to the first edge being applied thereto more than a minimum length of time before a reference edge of a reference pulse;

the configuration circuitry further configuring the device to include a second element which produces a second output in response to the second edge being applied thereto more than the minimum length of time before the reference edge of a reference pulse; and scanning circuitry for repeatedly applying first, second and reference pulses to the first and second elements with the delay of the reference edge being progressively decreased from a first value at which the first and second outputs are produced to a second value at which one of the first and second outputs is produced and the other of the first and second outputs is not produced;

the scanning circuitry further repeatedly applying first, second and reference pulses to the first and second elements with the delay of the reference edge being progressively decreased from the second value to a third value at which the first and second outputs are not produced; and the scanning circuitry further calculating the time difference as corresponding to a difference between the second and third values.

43. An apparatus as in claim 42, in which the first and second pulses are input pulses.

44. An apparatus as in claim 43, in which:

the configuration circuitry configures the first element as including a D-type flip-flop with the reference pulses being applied to a clock input and the first pulses being applied to a data input thereof; and the configuration circuitry configures the second element as including a D-type flip-flop with the reference pulses being applied to a clock input and the second pulses being applied to a data input thereof.

45. An apparatus as in claim 42, in which the first pulse is an input pulse and the second pulse is an output pulse.

46. An apparatus as in claim 45, in which:

the configuration circuitry configures the first element as including a first D-type flip-flop with the reference pulses being applied to a clock input and the first pulses being applied to a data input thereof; and the configuration circuitry configures the second element as including a second D-type flip-flop with the reference pulses being applied to a clock input thereof, and a third D-type flip-flop with the first pulses applied to a clock input thereof, an output being connected to a data input of the second D-type flip-flop, and the output pulses being applied through an inverter to a data input of the third D-type flip-flop.

47. An apparatus as in claim 42, in which the first and second pulses are output pulses.

48. An apparatus as in claim 47, in which:

the configuration circuitry configures the first element as including a D-type flip-flop with the reference pulses being applied to a clock input and the first pulses being applied to a data input thereof; and the configuration circuitry configures the second element as including a D-type flip-flop with the reference pulses being applied to a clock input and the second pulses being applied to a data input thereof.

49. An apparatus as in claim 42, in which the delay setting circuitry, the scanning circuitry, the configuration circuitry and the memory are separate from the device.

50. An apparatus as in claim 49, in which:

the device is programmable; and at least one of the delay setting circuitry and the scanning circuitry is constituted by a programmed portion of the device.

* * * * *